United States Patent
Shin et al.

(10) Patent No.: US 9,235,082 B2
(45) Date of Patent: Jan. 12, 2016

(54) LIGHT EMITTING DIODE PACKAGE, METHOD OF FABRICATING THE SAME, AND DISPLAY APPARATUS HAVING THE SAME

(75) Inventors: Myeong-Ju Shin, Seoul (KR); Jaewoo Jung, Cheonan-si (KR); YoungSic Kim, Seoul (KR); Seung Hwan Baek, Seoul (KR); Yeongbae Lee, Bucheon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 690 days.

(21) Appl. No.: 13/231,816

(22) Filed: Sep. 13, 2011

(65) Prior Publication Data
US 2012/0250351 A1   Oct. 4, 2012

(30) Foreign Application Priority Data
Mar. 31, 2011   (KR) .................. 10-2011-0029801

(51) Int. Cl.
*F21V 7/04*   (2006.01)
*G02F 1/1335*   (2006.01)
*H01L 33/44*   (2010.01)
*H01L 33/50*   (2010.01)

(52) U.S. Cl.
CPC ............... *G02F 1/133603* (2013.01); *G02F 2001/133614* (2013.01); *G02F 2001/133624* (2013.01); *H01L 33/44* (2013.01); *H01L 33/507* (2013.01)

(58) Field of Classification Search
CPC ............. G02F 1/133602; G02F 2001/133614; G02F 2001/133624; H01L 33/44; H01L 33/507
USPC ................... 362/608, 97.1–97.4, 84, 230–235
See application file for complete search history.

(56) References Cited

U.S. PATENT DOCUMENTS

| | | | |
|---|---|---|---|
| 7,350,933 B2 * | 4/2008 | Ng et al. | 362/84 |
| 2008/0074583 A1 * | 3/2008 | Li et al. | 349/71 |
| 2008/0123023 A1 * | 5/2008 | Doan et al. | 349/70 |
| 2009/0127576 A1 | 5/2009 | Jang et al. | |
| 2009/0213296 A1 | 8/2009 | Park et al. | |
| 2010/0066813 A1 | 3/2010 | Jorke | |
| 2010/0103648 A1 | 4/2010 | Kim et al. | |
| 2010/0208041 A1 | 8/2010 | Savvateev et al. | |
| 2010/0225836 A1 * | 9/2010 | Ockenfuss | 349/15 |
| 2011/0002140 A1 * | 1/2011 | Tsukahara et al. | 362/602 |
| 2014/0055982 A1 * | 2/2014 | Tao et al. | 362/84 |

FOREIGN PATENT DOCUMENTS

| | | |
|---|---|---|
| CN | 1880835 A | 12/2006 |
| CN | 101887174 A | 11/2010 |
| CN | 101943374 A | 1/2011 |

(Continued)

*Primary Examiner* — Anh Mai
*Assistant Examiner* — Jessica M Apenteng
(74) *Attorney, Agent, or Firm* — Innovation Counsel LLP

(57) ABSTRACT

A light emitting diode package, a method of fabricating the same, and a display apparatus having the same are provided. The light emitting diode package includes a light emitting diode, a quantum dot layer, a band pass filter, disposed in a housing. The light emitting diode emits light of a first color. The quantum dot layer includes a plurality of quantum dots disposed on the light emitting diode to absorb a portion of the light emitted by the diode, and then emit light of a second color. The band pass filter is disposed on the quantum dot layer and has a first pass band corresponding to the light emitted from the diode and a second pass band corresponding to the light emitted from the quantum dots.

20 Claims, 15 Drawing Sheets

(56) References Cited

FOREIGN PATENT DOCUMENTS

| | | |
|---|---|---|
| JP | 2001501380 A | 1/2001 |
| JP | 2002510866 A | 4/2002 |
| JP | 2004-193581 A | 7/2004 |
| JP | 2010177656 A | 8/2010 |
| JP | 2010204663 A | 9/2010 |
| JP | 2010537254 A | 12/2010 |
| KR | 1020070101046 A | 10/2007 |
| KR | 1020090093202 A | 9/2009 |
| KR | 10-2012-0064925 A | 6/2012 |
| WO | 2009026888 A1 | 3/2009 |

* cited by examiner

LIGHT EMITTING DIODE PACKAGE, METHOD OF FABRICATING THE SAME, AND DISPLAY APPARATUS HAVING THE SAME

CROSS-REFERENCE TO RELATED APPLICATIONS

This U.S. non-provisional patent application claims priority under 35 U.S.C. §119 of Korean Patent Application No. 10-2011-0029801, filed on Mar. 31, 2011, the entire contents of which are hereby incorporated by reference.

BACKGROUND

The present disclosure relates to a light emitting diode package, a method of fabricating the same, and a display apparatus having the same. More particularly, the present disclosure relates to a light emitting diode package including a quantum dot layer and a band pass filter to improve color reproduction, a method of fabricating the same, and a display apparatus having the same.

In general, light emitting diode (LED) packages use light emitting diodes that emit light having one of the three fundamental colors, i.e., red, green, or blue. An LED is manufactured by joining a P-type semiconductor and an N-type semiconductor with each other. When electrons and holes are combined with each other near the PN junction layer, the LED emits light having energy corresponding to a band gap.

To realize white light, LED packages use phosphor, which may be included in a layer over the LED. The phosphor absorbs a portion of light emitted from the LED and is excited, to generate light having a different color. For example, when an LED emitting blue light is used, red phosphor and green phosphor may be used in the LED package, so that the LED package emits white light.

LED packages that include a blue LED and red and green phosphors are used as light sources in 3D displays. In one method of displaying a three-dimensional image, a display emits light specifically for the left eye and light specifically for the right eye. The light specifically for each eye has wavelengths which are different from each other, as the differing wavelengths reaching each eye from the display allow a three-dimensional image to be perceived by a viewer. To provide light having wavelengths specific to each eye, a display includes a filter. However, when the light used for the display is generated in an LED package, the light has a wide full width at half maximum (FWHM). When this light is filtered to obtain light with differing wavelengths for the left eye and the right eye, color reproduction range differences and a brightness differences between left and right eye images may be large, due to the wide FWHM.

SUMMARY

A light emitting diode package including a quantum dot layer and a band pass filter to improve color reproduction is provided.

A method of fabricating the light emitting diode package is also provided.

A display apparatus including the light emitting diode package is also provided.

A display apparatus includes a backlight unit and a display panel.

The backlight unit may include a first light emitting diode package emitting a first light and a second light emitting diode package emitting a second light different from the first light. The display panel receives the first and second light to display an image.

The first light emitting diode package may include a first light emitting diode, a first quantum dot layer, a first band pass filter, and a first housing. The first quantum dot layer may include a plurality of quantum dots and be disposed on the first light emitting diode. The first band pass filter may be disposed on the first quantum dot layer. The first housing may receive the first light emitting diode, the first quantum dot layer, and the first band pass filter.

The second light emitting diode package may include a second light emitting diode, a second quantum dot layer, a second band pass filter, and a second housing. The second quantum dot layer may include a plurality of quantum dots and be disposed on the second light emitting diode. The second band pass filter may be disposed on the second quantum dot layer. The second housing may receive the second light emitting diode, the second quantum dot layer, and the second band pass filter.

In another aspect a light emitting diode package includes a light emitting diode, a quantum dot layer, a band pass filter, and a housing.

The light emitting diode may emit first light. The quantum dot layer may include a plurality of quantum dots disposed on the light emitting diode and configured to absorb a portion of the first light and emit second light having a wavelength different from a wavelength of the first light. The band pass filter may be disposed on the quantum dot layer and have a first pass band corresponding to the first light and a second pass band corresponding to the second light. The housing may receive the light emitting diode and support the quantum dot layer and the band pass filter.

In another aspect, a method of fabricating a light emitting diode package is provided.

A band pass filter may be prepared. A quantum dot layer including a plurality of quantum dots may be coated onto the band pass filter. The band pass filter on which the quantum dot layer is coated may be mounted in a housing including a light emitting diode.

BRIEF DESCRIPTION OF THE DRAWINGS

The accompanying figures are included to provide a further understanding, and are incorporated in and constitute a part of this specification. The drawings illustrate exemplary embodiments and, together with the description, serve to explain principles of the inventive concept. In the figures.

DETAILED DESCRIPTION OF THE EMBODIMENTS

Figure 1:
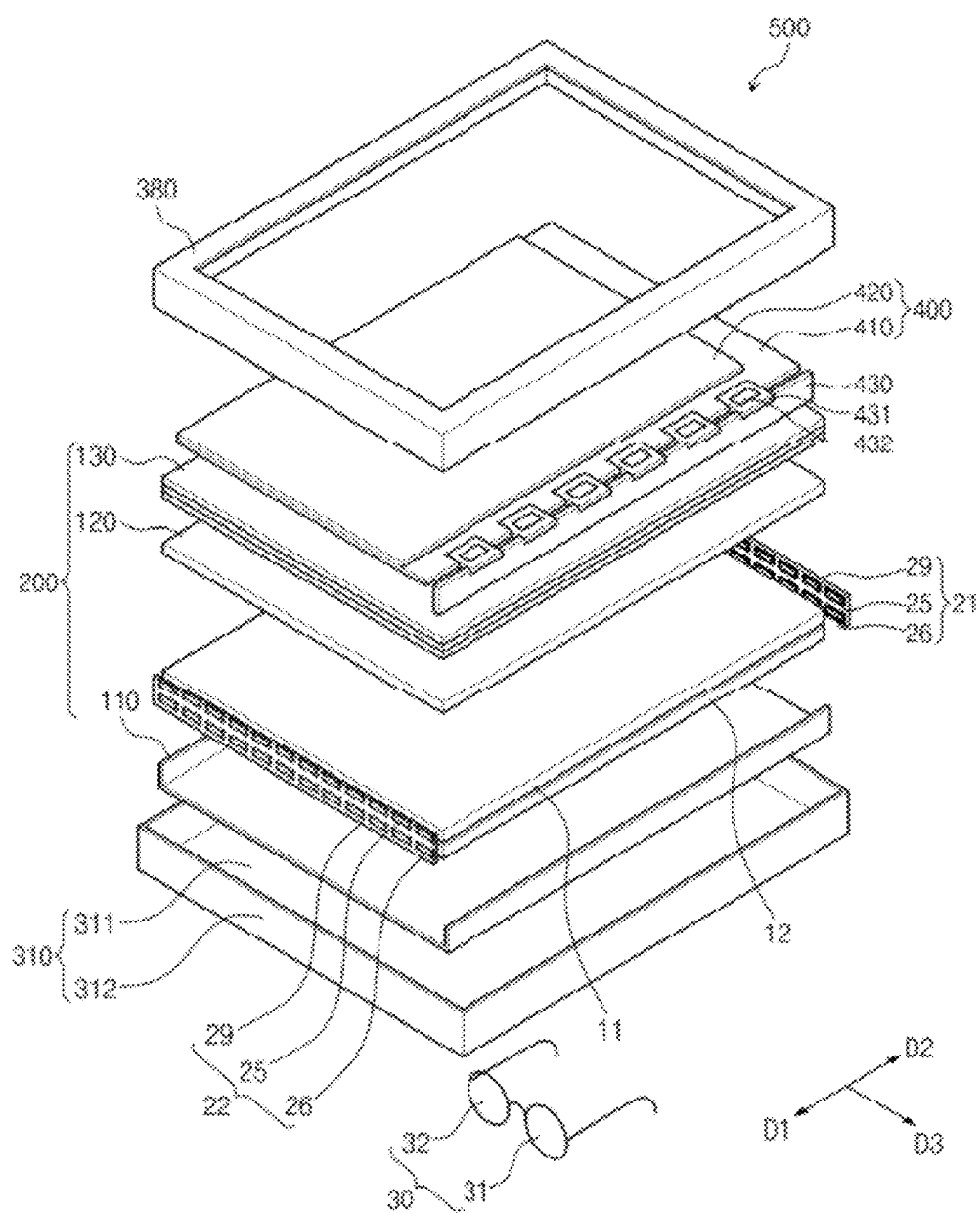
FIG. 1 is an exploded perspective view of a display apparatus according to an embodiment.

Exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention. The drawings and description are to be regarded as illustrative in nature and not restrictive. Like reference numerals are used to designate like elements throughout the specification.

In the drawings, the dimensions and size of each structure are exaggerated, omitted, or schematically illustrated for convenience of description and clarity. It will be understood that although the terms of first and second are used herein to describe various elements, these elements should not be limited by these terms. Terms are only used to distinguish one component from other components. Therefore, a component referred to as a first component in one embodiment can be referred to as a second component in another embodiment. The terms of a singular form may include plural forms unless referred to the contrary.

The meaning of 'comprise', 'include', or 'have' specifies a property, a region, a fixed number, a step, a process, an element and/or a component but does not exclude other properties, regions, fixed numbers, steps, processes, elements and/or components. In the specification, it will be understood that when a layer (or film), a region, or a plate is referred to as being 'on' another layer (or film), region, or plate, it can be directly on the other layer (or film), region, or plate, or intervening layers (or films), regions, or plates may also be present. In the specification, it will be understood that when a layer (or film), a region, or a plate is referred to as being 'under' another layer, region, or plate, it can be directly under the other layer, region, or plate, or intervening layers, regions, or plates may also be present.

Hereinafter, embodiments will be described in detail with reference to the accompanying drawings.

FIG. 1 is an exploded perspective view of a display apparatus according to an embodiment.

Referring to FIG. 1, a display apparatus 500 includes a backlight unit 200, a display panel 400, a bottom chassis 310, and a top chassis 380.

The backlight unit 200 includes a first light source 21, a second light source 22, a first light guide plate 11, a second light guide plate 12, a reflection plate 110, a diffusion plate 120, and optical sheets 130.

The first and second light sources 21 and 22 generate light used for the display apparatus 500 to display an image. Also, the first and second light guide plates 11 and 12 guide the light emitted from the first and second light sources 21 and 22 toward the display panel 400.

The coupled relationship between the first and second light sources 21 and 22 and the first and second light guide plates 11 and 12, and the path of the light emitted from each of the first and second light sources 21 and 22 will be described below.

The first light source 21 is disposed adjacent to one side of the first and second light guide plates 11 and 12. The light generated from the first light source 21 is emitted in a first direction D1 toward and into the first and second light guide plates 11 and 12. Also, the second light source 22 is disposed adjacent to the other side of the first and second light guide plates 11 and 12 and facing the first light source 21. The light generated from the second light source 22 is emitted in a second direction D2 toward and into the first and second light guide plates 11 and 12.

The first light source 21 includes a plurality of first light emitting diode packages 25, a plurality of second light emitting diode packages 26, and a printed circuit board (PCB) 29. Also, the second light source 22 includes a plurality of first light emitting diode packages 25, a plurality of second light emitting diode packages 26, and a printed circuit board (PCB) 29.

The first light emitting diode packages 25 are disposed on the PCB 29 along a third direction D3. The second light emitting diode packages 26 are disposed on the PCB 29 along the third direction D3. Also, the second light emitting diode packages 26 are disposed under the first light emitting diode packages 25 in one-to-one correspondence with each other, so that a second light emitting diode package 26 is underneath each of the first light emitting diode packages 25.

The light emitted from the first light emitting diode packages 25 enters the first light guide plate 11, and the light emitted from the second light emitting diode packages 26 enters the second light guide plate 12. Thus, the first light guide plate 11 guides the light emitted from the first light emitting diode packages 25 toward the display panel 400, and the second light guide plate 12 guides the light emitted from the second light emitting diode packages 26 toward the display panel 400.

The display apparatus 500 may further include glasses 30 through which a viewer sees a three-dimensional (3D) image. The glasses 30 include a first filter glass 31 for a left eye image and a second filter glass 32 for a right eye image. The light emitted from the first light emitting diode packages 25 may pass through the first filter glass 31, and then be provided to the viewer. Likewise, light emitted from the second light emitting diode packages 26 may pass through the second filter glass 32, and then be provided to the viewer. Thus, the light emitted from the first and second light emitting diode packages 25 and 26 may be used for realizing the 3D image. For example, the backlight unit 200 may alternately emit a first light generated in the first light emitting diode packages 25 and a second light generated in the second light emitting diode packages 26. The display panel 400 then receives the first and second light to display the 3D image.

According to an embodiment, the first and second light sources 21 and 22 may be separately operated to provide light to the first and second light guide plates 11 and 12 that have intensities that are different from each other. Thus, the light provided toward the display panel 400 through the first and second light guide plates 11 and 12 may have intensities that are different from each other according to positions of display regions in which images are displayed through the display panel 400. The display apparatus 500 may thus be operated in a so-called local dimming manner.

The reflection plate 110 may be formed of, for example, polyethylene terephthalate (PET) or a material for reflecting light such as aluminum. The reflection plate 110 is disposed on a bottom 311 of the bottom chassis 310 to reflect the light emitted from the first and second light sources 21 and 22. As a result, the reflection plate 110 increases an intensity of the light provided toward the display panel 400.

The diffusion plate 120 is disposed between the light guide plate 10 and the display panel 400. The diffusion plate 120 diffuses the light emitted from the light guide plate 10. As a result, the uniformity of the intensity of light provided by unit area of the display panel 400 may be improved by the diffusion plate 120.

The optical sheets 130 are disposed between the display panel 400 and the diffusion plate 120. The optical sheets 130 may include prism sheets for collecting the light emitted from the diffusion plate 120, which function to enhance frontal brightness, and diffusion sheets for diffusing the light emitted from the diffusion plate 120.

According to an embodiment, the display panel 400 may be a liquid crystal panel. The display panel 400 receives light emitted from the backlight unit 200 to display an image. When the display apparatus 500 is used as a 3D display apparatus that displays a separate left eye image and right eye image, the display panel 400 may display a 3-D image using the light emitted from the first and second light emitting diode packages 25 and 26. In particular, the display panel 400 may alternately display the left eye image and the right eye image by a frame unit. That is, when the light is emitted from the first light emitting diode packages 25, the left eye image may be displayed. When the light is emitted from the second light emitting diode packages 26, the right eye image may be displayed.

The display panel 400 includes a first substrate 410, a second substrate 420 facing the first substrate 410, and a liquid crystal (not shown) disposed between the first substrate 410 and the second substrate 420.

According to an embodiment, the first substrate 410 may include a plurality of pixel electrodes (not shown) and a plurality of thin film transistors electrically connected with the pixel electrodes. Each of the thin film transistors switches on or off a driving signal provided to each of pixel electrodes. Also, the second substrate 420 may include color filter layers disposed in positions corresponding to the positions of the pixel electrodes, and an opposite electrode configured to form an electric field together with the pixel electrodes to control the arrangement of the liquid crystal.

A printed circuit board (PCB) 430 for outputting the driving signal to the display panel 400 is disposed on a side of the display panel 400. The PCB 430 is connected to the display panel 400 through a plurality of tape carrier packages (TCPs) 431. A plurality of driving chips 432 are mounted on the TCPs 431.

Each of the driving chips 432 may include a data driver (not shown) for outputting a data signal to the display panel 400. Here, a gate driver (not shown) for outputting a gate signal to the display panel 400 may be directly formed on the display panel 400 using a thin film process. Also, the driving chips 432 may be mounted on the display panel 400 in a chip on glass (COG) form. In such case, the driving chips 432 may be integrated into one chip.

The bottom chassis 310 includes the bottom 311 and sidewalls 312 that extend up from the bottom 311 to provide a receiving space in which the backlight unit 200 and the display panel 400 are received. Also, the top chassis 380 is coupled to the bottom chassis 310 to stably fix the backlight unit 200 and the display panel 400 to the inside of the bottom chassis 310.

Although the backlight unit 200 includes only the first and second light sources 21 and 22 disposed adjacent to a short side of the display panel 400 in FIG. 1, the present disclosure is not limited thereto. For example, the first and second light sources 21 and 22 may be disposed adjacent to a long side of the display panel 400, or the backlight unit 200 may include light sources disposed adjacent to the long side of the display panel 400.

Figure 2:
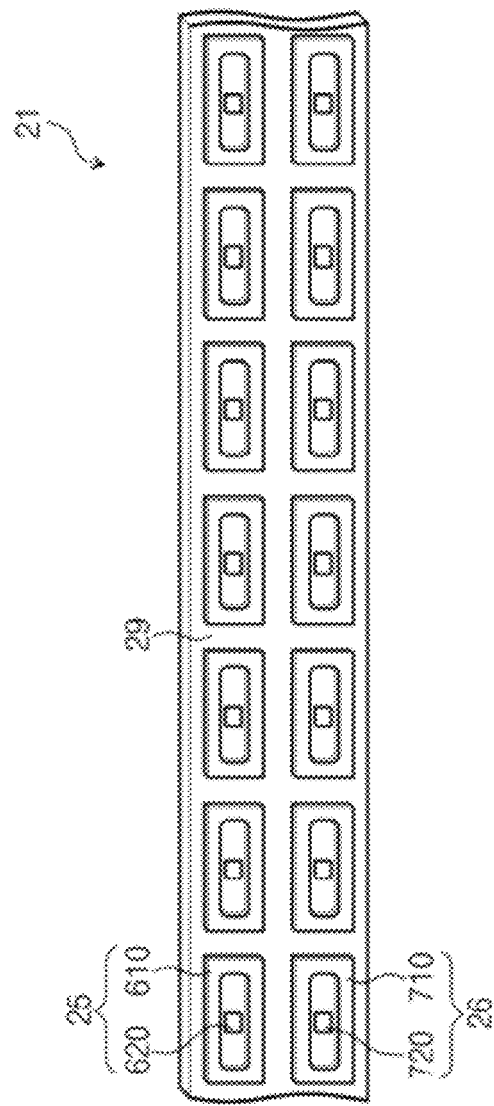
FIG. 2 is an enlarged perspective view illustrating a first light source of FIG. 1.
Figure 3:
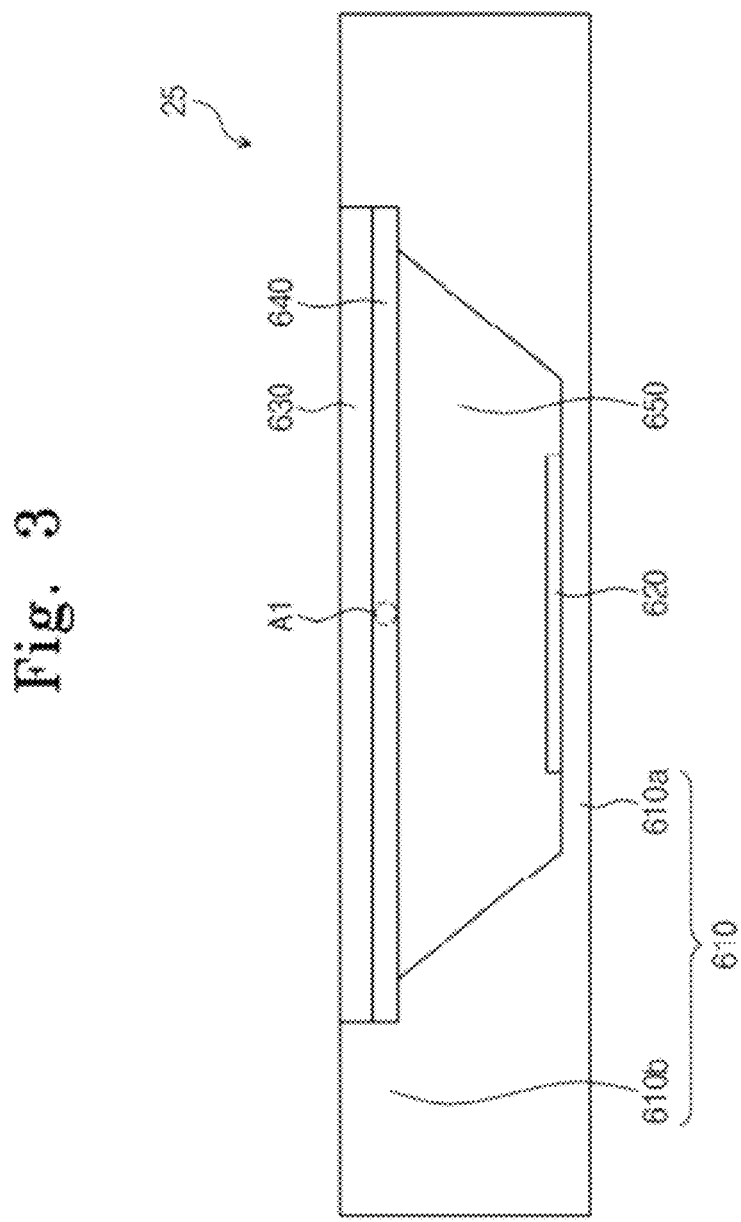
FIG. 3 is a sectional view illustrating an example of a first light emitting diode package of FIG. 2.

FIG. 2 is an enlarged perspective view illustrating a first light source 21 of FIG. 1, and FIG. 3 is a sectional view illustrating an example of a first light emitting diode package of FIG. 2.

Referring to FIGS. 2 and 3, the first light source 21 includes the first light emitting diode package 25, the second light emitting diode package 26, and the PCB 29. The first light emitting diode package 25 includes at least one first light emitting diode 620, a first band pass filter 630, a first quantum dot layer 640, a air gap, or air layer 650, and a first housing 610.

The first light emitting diode 620 is mounted within the first housing 610 to emit light having one color, e.g., blue light. Although not shown in FIGS. 2 and 3, the first light emitting diode 620 is electrically connected to two lead frames electrically connected to the PCB 29 to receive a driving voltage. Thus, the first light emitting diode 620 generates light according to the voltage applied to the lead frames. Also, although not shown, a thermal pad or heatsink for releasing heat generated in the first light emitting diode 620 may be disposed under the first light emitting diode 620.

The first housing 610 has a first bottom portion 610*a* and a first side portion 610*b* extending from the first bottom portion 610*a* in a substantially vertical direction. Also, the first housing 610 has an inner space in which the first light emitting diode 620, the first band pass filter 630, and the first quantum dot layer 640 are received, and has a shape in which a side thereof is opened. That is, the first light emitting diode 620 is mounted on the first bottom portion 610*a*, and the first band pass filter 630 and the first quantum dot layer 640 are mounted with their sides on the first side portion 610*b*. The first side portion 610*b* supports the first band pass filter 630 and the first quantum dot layer 640.

The first housing 610 may be formed of an insulation polymer such asplastic. For example, the first housing 610 may be formed of a material such as polyphthalamide (PPA) or ceramic. The first bottom portion 610*a* and the first side portion 610*b* may be integrally formed using a molding process when the first housing 610 is manufactured.

Figure 4:
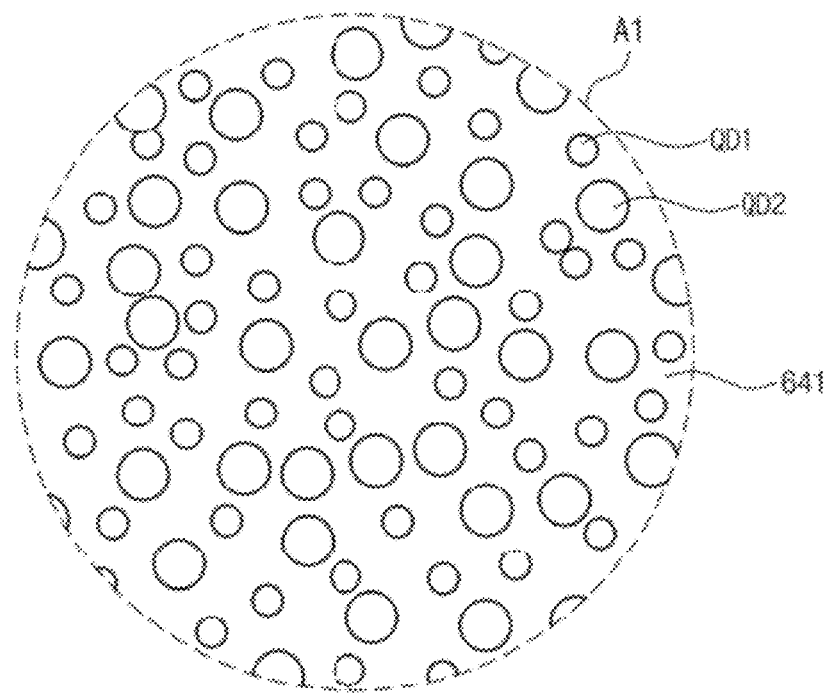
FIG. 4 is an enlarged view illustrating a region A1 of FIG. 3.

FIG. 4 is an enlarged view illustrating a region A1 of FIG. 3.

Referring to FIGS. 3 and 4, the first quantum dot layer 640 is disposed on the first light emitting diode 620 facing the first light emitting diode 620. An air layer 650 is disposed between the first quantum dot layer 640 and the first light emitting diode 620. The quantum dot layer 640 may have a thickness of about 100 nm to about 1,000 μm. Also, the first quantum dot layer 640 may contact with the first band pass filter 630 and be integrated with the first band pass filter 630. As described above, when the first quantum dot layer 640 is provided in a thin film shape, the air layer 650 may be disposed between the first light emitting diode 620 and the first quantum dot layer 640 to easily diffuse heat generated in the first light emitting diode 620 to the outside. Thus, the air layer 650 may prevent the first quantum dot layer 640 from being deformed by heat.

The first quantum dot layer 640 includes a polymer resin 641 and a plurality of quantum dots QD1 and QD2, which are dispersed within the polymer resin 641. The polymer resin 641 may be formed of an insulating polymer, e.g., a silicon resin, an epoxy resin, or an acryl resin.

Each of the quantum dots QD1 and QD2 is a nano material. Each of the quantum dots QD1 and QD2 includes a core formed of a material having a small band gap, a shell surrounding the core and formed of a material having a large band gap, and a ligand attached to the shell. Each of the quantum dots QD1 and QD2 has a globular shape having a diameter of several nm to several tens of nm or several hundred nm. Each of the quantum dots QD1 and QD2, because of their nano size, causes a quantum confinement effect. A main characteristic of the quantum confinement effect is that, as the dot becomes smaller, the band gap becomes larger, and the band gap in the dot has a discontinuous band gap structure having a different shape from that which occurs in a bulk crystal, such as in one individual atom. A size of the discontinuous band gap may be adjusted in the quantum dots QD1 and QD2 by adjusting the size of each of the quantum dots QD1 and QD2. When a quantum dot is excited, the color of light emitted by the quantum dot is determined by the size of the quantum dot QD1 and QD2. Because light having a longer wavelength is generated as each of the quantum dots QD1 and QD2 increases in size, the quantum dots QD1 and QD2 may be adjusted in size to adjust a wavelength of the emitted light. Additionally, when the quantum dots QD1 and QD2 are synthesized so that they have the same uniform size distribution, a light transforming material that has a spectral distribution with a narrow full width at half maximum (FWHM) can be made.

According to the embodiments, the quantum dots QD1 and QD2 absorb light emitted from the first light emitting diode 620 to emit light having a wavelength corresponding to the band gap of each of the quantum dots QD1 and QD2. Particularly, light emitted from the first light emitting diode 620 is referred to as first light, and light emitted from the quantum dots QD1 and QD2 is referred to as second light. Here, the first light has a wavelength less than that of the second light. This is as a result of a law of energy. That is, the quantum dots QD1 and QD2 do not emit light having energy greater than that of the absorbed light. Thus, the second light has a wavelength greater than or equal to that of the first light.

Each of the quantum dots QD1 and QD2 may include at least one of group II-VI quantum dots such as ZnS, ZnSe, ZnTe, CdS, CdSe, CdTe, HgS, HgSe, and HgTe and group III-V quantum dots such as PbS, PbSe, PbTe, MN, AlP, AlAs, AlSb, GaN, GaAs, GaSb, InN, InP, InAs, and InSb.

When the first light emitting diode 620 is a blue light emitting diode, the first quantum dot layer 640 disposed above the first light emitting diode 620 may include at least one kind of quantum dots of the first quantum dot QD1 emitting green light and the second quantum dot QD2 emitting red light. The second quantum dot QD2 has a diameter greater than that of the first quantum dot QD1. FIG. 4 illustrates the first quantum dot layer 640 including the first and second quantum dots QD1 and QD2. When the first quantum dot layer 640 includes, as shown in FIG. 4, the first and second quantum dots QD1 and QD2, the first light emitting diode package 25 may emit white light in which red, green, and blue light are mixed.

Figure 5:
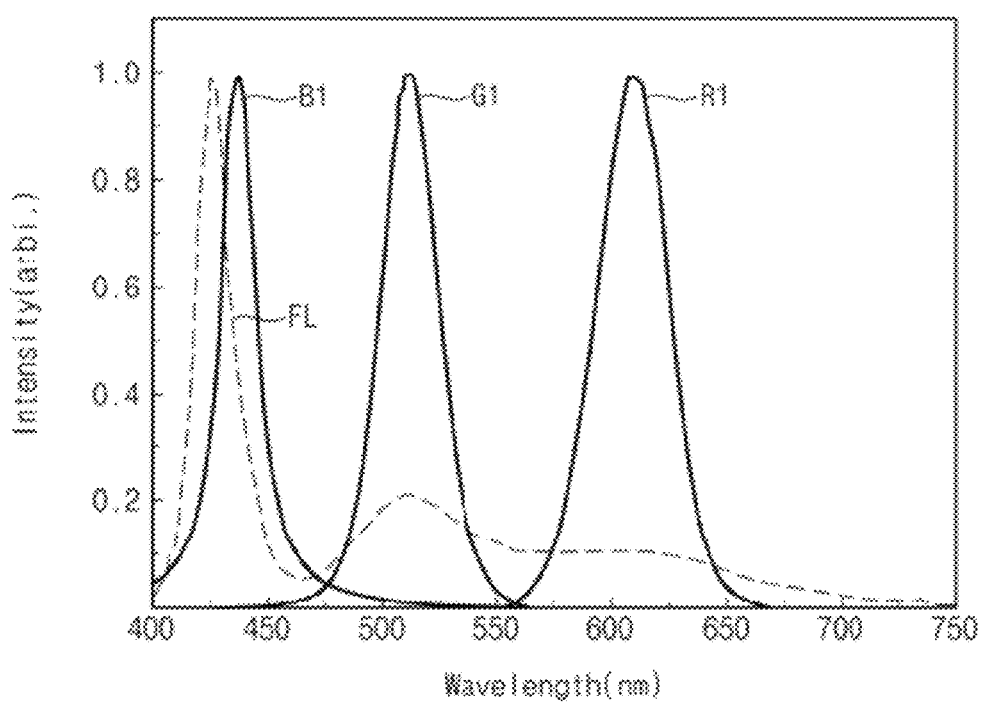
FIG. 5 is a spectral distribution graph of light emitted from a quantum dot layer of FIG. 3.

FIG. 5 is a spectral distribution graph of light emitted from a quantum dot layer of FIG. 3.

Referring to FIG. 5, the first quantum dot layer 640 receives light from the first light emitting diode 620 to emit first blue light B1, first green light G1, and first red light R1. The first blue light B1 is emitted from the first light emitting diode 620, the first green light G1 is emitted from the first quantum dot QD1, and the first red light R1 is emitted from the second quantum dot QD2.

FIG. 5 also illustrates a spectral distribution graph FL (in dashed lines) of a light emitting diode package manufactured using a blue light emitting diode and a phosphor emitting green and red light. In the spectral distribution graph of the phosphor light emitting diode package, it is seen that a peak value is small and a FWHM is large in green and red regions (respectively, approximately 500-550 nm and approximately 600-650 nm) when compared to the blue region (approximately 400-450 nm). Also, it is seen that each of the first blue light B1, the first green light G1, and the first red light R1 emitted from the first quantum dot layer 640 has a large peak value and a narrow FWHM when compared to those of the light emitted from the phosphor. Each of the quantum dots used in the first light emitting diode package 25 may be adjusted in size and amount to control a wavelength and brightness of the light emitted from the first light emitting diode package 25.

Figure 6:
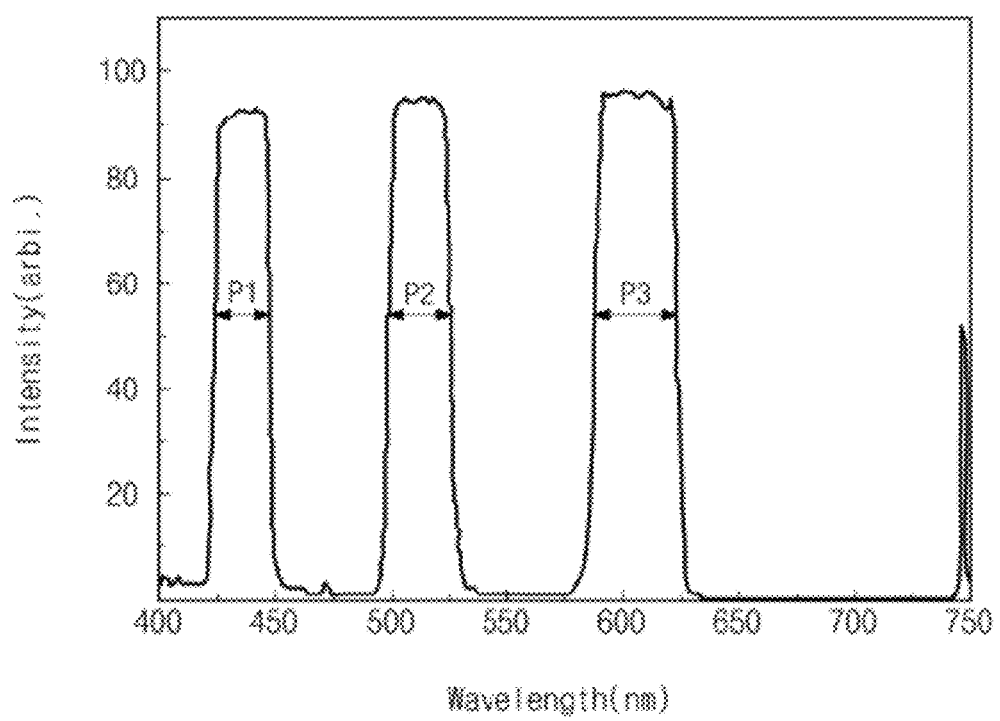
FIG. 6 is a spectral distribution graph of a first band pass filter of FIG. 3.

FIG. 6 is a spectral distribution graph for first band pass filter 630 of FIG. 3.

Referring to FIGS. 3 and 6, the first band pass filter 630 may transmit light having specific bands, i.e., a specific range of wavelengths, and reflect or absorb light that is outside of the specific bands. For example, the first band pass filter 630 may be an interference filter. In particular, the first band pass filter 630 may transmit only the first blue light B1, the first green light G1, and the first red light R1, and absorb or reflect light that is not in the wavelength region of the first blue light B1, the first green light G1, and the first red light R1. Although not shown in FIG. 3, the first band pass filter 630 may have a structure in which a plurality of films, which have reflective indexes that are different from each other, are stacked. For example, each of the films may be formed of polyethylene naphthalate (PEN) or polystyrene (PS).

Referring to FIG. 6, the first band pass filter 630 includes a first pass band P1 that transmits wavelengths in the range of the first blue light B1, a second pass band P2 that transmits wavelengths in range of the first green light G1, and a third pass band P3 that transmits wavelengths in the range of the first red light R1. For example, the first pass band P1 may include wavelengths ranging from about 400 nm to about 500 nm, the second pass band P2 may include wavelength ranging from about 500 nm to about 580 nm, and the third pass band P3 may include wavelength ranging from about 580 nm to about 700 nm. Thus, only the light with wavelengths within the first to third band passes P1, P2, and P3 among the first blue, green, and red light B1, G1, and R1 may be transmitted through the band pass filter 630 to be emitted to the outside of the first light emitting diode package 25.

A filter having the same pass bands as that of the first band pass filter 630 may be used in the first filter glass (see reference numeral 31 of FIG. 1). Thus, the light emitted from the first light emitting diode package 25 may reach a left eye of the viewer through the first filter glass 31.

Figure 7:
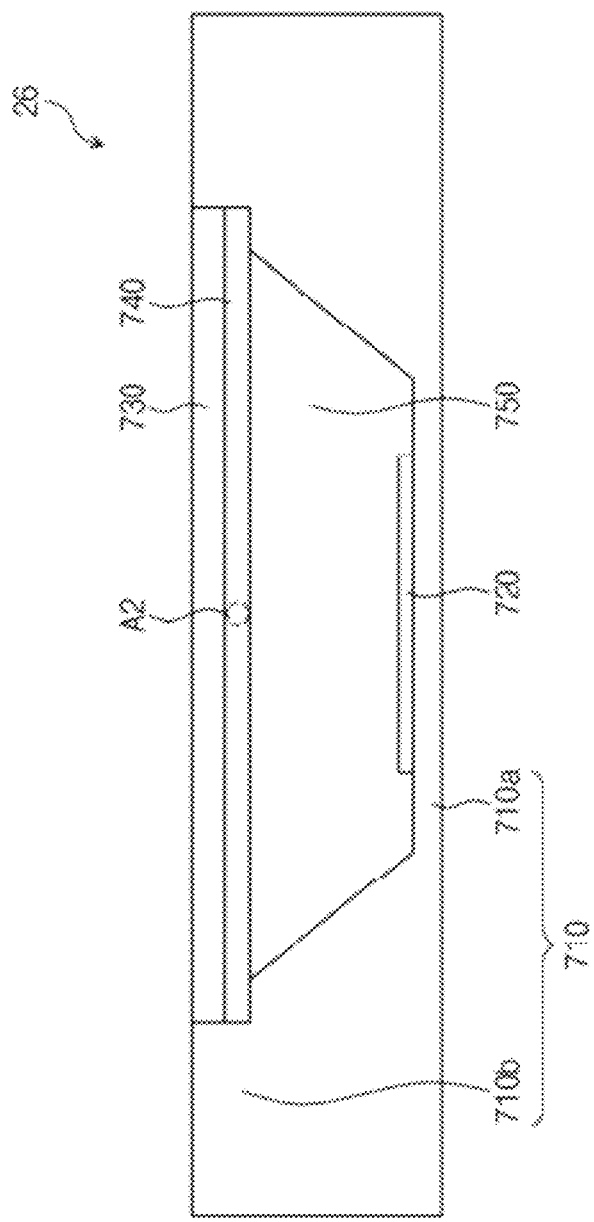
FIG. 7 is a sectional view illustrating an example of a second light emitting diode package of FIG. 2.
Figure 8:
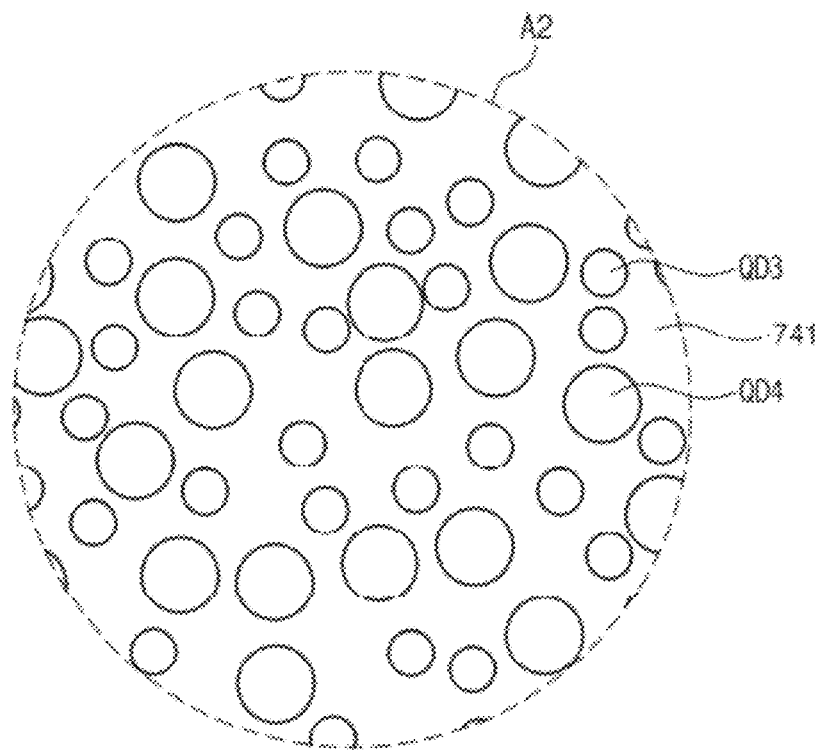
FIG. 8 is an enlarged view illustrating a region A2 of FIG. 7.
Figure 9:
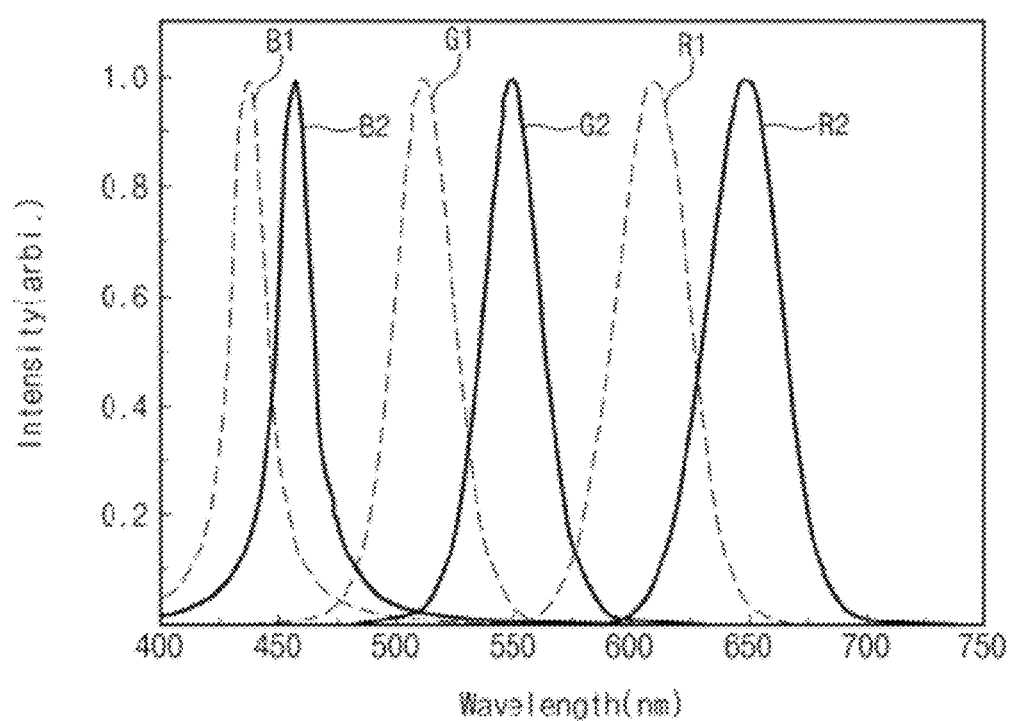
FIG. 9 is a spectral distribution graph of light emitted from a quantum dot layer of FIG. 7.
Figure 10:
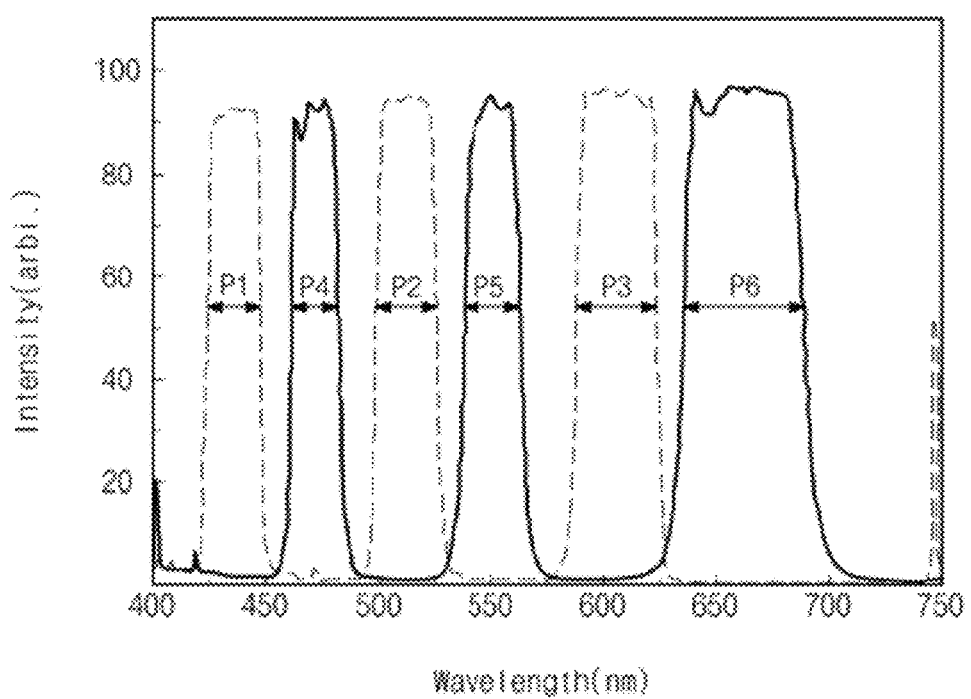
FIG. 10 is a spectral distribution graph of a first band pass filter of FIG. 7.

FIG. 7 is a sectional view illustrating an example of a second light emitting diode package of FIG. 2, and FIG. 8 is an enlarged view illustrating a region A2 of FIG. 7. FIG. 9 is a spectral distribution graph of light emitted from a quantum dot layer of FIG. 7, and FIG. 10 is a spectral distribution graph for a first band pass filter of FIG. 7.

Referring to FIGS. 2 and 7, the second light emitting diode package 26 includes at least one second light emitting diode 720, a second band pass filter 730, a second quantum dot layer 740, an air layer 750, and a second housing 710.

The second light emitting diode 720 is mounted within the second housing 710 to emit light having one color, e.g., blue light. Although not shown in FIGS. 2 and 7, the second light emitting diode 720 is electrically connected to two lead frames electrically connected to the PCB 29 to receive a driving voltage. Thus, the second light emitting diode 720 generates light according to the voltage applied to the lead frames.

The second housing 710 has a second bottom portion 710a and a second side portion 710b extending from the second bottom portion 710a in a substantially vertical direction. Also, the second housing 710 has an inner space in which the second light emitting diode 720, the second band pass filter 730, and the second quantum dot layer 740 are received, and has a shape in which a side thereof is opened. That is, the second light emitting diode 720 is mounted on the second bottom portion 710a, and the second band pass filter 730 and the second quantum dot layer 740 are mounted with their sides on the second side portion 710b. The second side portion 710b supports the second band pass filter 730 and the second quantum dot layer 740.

Referring to FIGS. 7 and 8, the second quantum dot layer 740 is disposed on the second light emitting diode 720 facing the second light emitting diode 720. An air layer 750 is disposed between the second quantum dot layer 740 and the second light emitting diode 720. The second quantum dot layer 740 may include a polymer resin 741 and a plurality of quantum dots QD3 and QD4 which are dispersed within the polymer resin 741.

According to the embodiments, the third and fourth quantum dots QD3 and QD4 absorb light emitted from the second light emitting diode 720 to emit light having a wavelength corresponding to the band gap of each of the third and fourth quantum dots QD3 and QD4. In particular, light emitted from the second light emitting diode 720 is referred to as third light, and light emitted from the third and fourth quantum dots QD1 and QD2 is referred to as fourth light. Here, the third light has a wavelength less than that of the fourth light.

When the second light emitting diode 720 is a blue light emitting diode, the second quantum dot layer 740 disposed above the second light emitting diode 720 may include at least one kind of quantum dots of the third quantum dot QD3 emitting green light and the fourth quantum dot QD4 emitting red light. The fourth quantum dot QD4 has a diameter greater than that of the third quantum dot QD3. FIG. 8 illustrates the second quantum dot layer 740 including the third and fourth quantum dots QD3 and QD4. When the second quantum dot layer 740 includes, as shown in FIG. 8, the third and fourth quantum dots QD3 and QD4, the second light emitting diode package 26 may emit white light in which red, green, and blue light are mixed.

Referring to FIG. 9, the second quantum dot layer 740 receives light from the second light emitting diode 720 to emit second blue light B2, second green light G2, and second red light R2. The second blue light B2 is emitted from the second light emitting diode 720, the second green light G2 is emitted from the third quantum dot QD3, and the second red light R2 is emitted from the fourth quantum dot QD4.

Referring to FIGS. 4, 5, 8, and 9, although both of the first and second light emitting diodes 620 and 720 emit blue light, the second blue light B2 emitted from the second light emitting diode 720 has a wavelength greater than that of the first blue light B1 emitted from the first light emitting diode 620. Also, the second green light G2 emitted from the third quantum dot QD3 has a wavelength greater than that of the first green light G1 emitted from the first quantum dot QD1. The second red light R2 emitted from the fourth quantum dot QD4 has a wavelength greater than that of the second quantum dot QD2. Because the larger size of the quantum dots, the longer the wavelength of light emitted from the quantum dot, to achieve the wavelength profile for B2, G2 and R2 relative to B1, G1 and R1 shown in FIG. 9, the third quantum dot QD3 has a size that is greater than that of the first quantum dot QD1, and the fourth quantum dot QD4 has a size that is greater than that of the second quantum dot QD2.

FIG. 9 illustrates the intensity as a function of wavelength for the first blue light B1, the first green light G1, and the first red light R1 as an example, so as to compare the first blue light B1, the first green light G1, and the first red light R1 to the second blue light B2, the second green light G2, and the second red light R2, respectively. The first and second blue light B1 and B2 have peak wavelengths corresponding to that of blue light, i.e., their peak wavelengths fall into the blue light wavelength range of about 424 nm to about 475 nm. The first and second blue light B1 and B2 have peak wavelengths that are different from each other. Also, referring to FIG. 9, the wavelength region that has an intensity of about ½ of that of the peak wavelength of each of the first and second blue light B1 and B2, i.e., wavelength regions corresponding to FWHM of the first and second blue light B1 and B2 do not overlap each other. That is, a peak wavelength of the first blue light B1 may be spaced apart from that of the second blue light B2 by one FWHM of one of the first and second blue light B1 and B2.

The first and second green light G1 and G2 have peak wavelengths corresponding to that of green light, i.e., their peak wavelengths fall into the green light wavelength range of about 500 nm to about 550 nm. The first and second green light G1 and G2 have peak wavelengths that are different from each other. Referring to FIG. 9, the wavelength region that has an intensity of about ½ of that of the peak wavelength of each of the first and second green light G1 and G2, i.e., wavelength regions corresponding to FWHM of the first and second green light G1 and G2 do not overlap each other. That is, a peak wavelength of the first green light G1 may be spaced apart from that of the second green light G2 by one FWHM of one of the first and second green light B1 and B2. Similarly, the first and second red light R1 and R2 have peak wavelengths corresponding to that of red light, i.e., their peak wavelengths fall into the red light wavelength range of about 600 nm to about 650 nm. The first and second red light R1 and R2 have peak wavelengths that are different from each other. Referring to FIG. 9, the wavelength region that has an intensity of about ½ of that of the peak wavelength of each of the first and second red light R1 and R2, i.e., wavelength regions corresponding to FWHM of the first and second red light R1 and R2 do not overlap each other. That is, a peak wavelength of the first red light R1 may be spaced apart from that of the second red light R2 by one FWHM of one of the first and second red light R1 and R2.

Referring to FIGS. 7 and 10, the second band pass filter 730 may transmit light having a specific band, i.e., specific ranges of wavelengths, and reflect or absorb light that is outside of the specific band. For example, the second band pass filter 730 may be an interference filter. In particular, the second band pass filter 730 may transmit only the second blue light B2, the second green light G2, and the second red light R2 and absorb or reflect light that is not in the wavelength region of the second blue light B2, the second green light G2, and the second red light R2.

Referring to FIG. 10, the second band pass filter 730 includes a fourth pass band P4 that transmits wavelengths in the range of the second blue light B2, a fifth pass band P5 that transmits wavelengths in the range of the second green light G2, and a sixth pass band P6 that transmits wavelengths in the range of the second red light R2. For example, the fourth pass band P4 may include wavelengths ranging from about 400 nm to about 500 nm, the fifth pass band P5 may include wavelength ranging from about 500 nm to about 580 nm, and the sixth pass band P6 may include wavelengths ranging from about 580 nm to about 700 nm. Thus, only the light with wavelengths within the fourth to sixth band passes P4, P5, and P6 among the second blue, green, and red light B2, G2, and R2 may be transmitted through the band pass filter 730 to be emitted to the outside of the second light emitting diode package 26.

A filter having the same pass bands as that of the second band pass filter 730 may be used in the second filter glass (see reference numeral 32 of FIG. 1). Thus, the light emitted from the second light emitting diode package 26 may reach a right eye of the viewer through the second filter glass 32.

The quantum dots included in the second quantum dot layer 740 of the second light emitting diode package 26 are adjusted in size so that light emitted from the second quantum dot layer 740 has blue, green, and red peak wavelengths of about 457 nm, about 549 nm, and 649 nm, respectively. A band pass filter in which pass bands corresponding to blue, green, and red colors, i.e., the fourth pass band P4, the fifth pass band P5, and the sixth pass band P6 respectively have wavelengths of about 460 nm to about 483 nm, about 536 nm to about 563 nm, and about 635 nm to about 689 nm may be used as the second band pass filter 730. Here, in a CIE 1931 color coordinate system, the white light emitted from the second light emitting diode package 26 has color coordinates (x=0.2456, y=0.2152). Also, with respect to the color reproduction of the light emitted from the second light emitting diode package 26, the light has an accordance rate of about 97.9% with sRGB and a color reproduction range of about 88.8% in comparison to NTSC.

TABLE 1

|  |  | Peak wavelength (nm) | Pass band (nm) | Color coordinates of white color | | Color reproduction | |
|---|---|---|---|---|---|---|---|
|  | color |  |  | X-axis | Y-axis | sRGB (color accordance rate, %) | NTSC (%) |
| First light emitting diode package | Blue color | 437 | 442-448 | 0.2456 | 0.2152 | 91.5 | 88.5 |
|  | Green color | 510 | 497-525 |  |  |  |  |
|  | Red color | 610 | 587-624 |  |  |  |  |
| Second light emitting diode package | Blue color | 457 | 460-483 | 0.2456 | 0.2152 | 97.9 | 88.8 |
|  | Green color | 549 | 536-536 |  |  |  |  |
|  | Red color | 649 | 635-689 |  |  |  |  |

FIG. 10 illustrates, in dashed lines, the first pass band P1, the second pass band P2, and the third pass band P3 as an example for comparison with, respectively, the fourth pass band P4, the fifth pass band P5, and the sixth pass band P6.

Referring to FIGS. 5, 6, 9, and 10, the first band pass filter 630 includes the first pass band P1, the second pass band P2, and the third pass band P3 which respectively transmit the first blue light B1, the first green light G1, and the first red light R1. The second band pass filter 730 includes the fourth pass band P4, the fifth pass band P5, and the sixth pass band P6 which respectively transmit the second blue light B2, the second green light G2, and the second red light R2.

The following Table 1 illustrates the characteristics of the first and second light emitting diode packages 25 and 26 according to an embodiment.

Referring to Table 1, the quantum dots included in the first quantum dot layer 640 of the first light emitting diode package 25 are adjusted in size so that light emitted from the first quantum dot layer 640 has blue, green, and red peak wavelengths of about 437 nm, about 510 nm, and 610 nm, respectively. A band pass filter in which pass bands corresponding to blue, green, and red colors, i.e., the first pass band P1, the second pass band P2, and the third pass band P3 respectively have wavelengths of about 442 nm to about 448 nm, about 497 nm to about 525 nm, and about 587 nm to about 624 nm may be used as the first band pass filter 630. Here, in a CIE 1931 color coordinate system, white light emitted from the first light emitting diode package 25 has color coordinates (x=0.2456, y=0.2152). Also, with respect to the color reproduction of the light emitted from the first light emitting diode package 25, the light has an accordance rate of about 91.5% with sRGB, and a color reproduction range of about 88.5% in comparison to NTSC.

Figure 11:
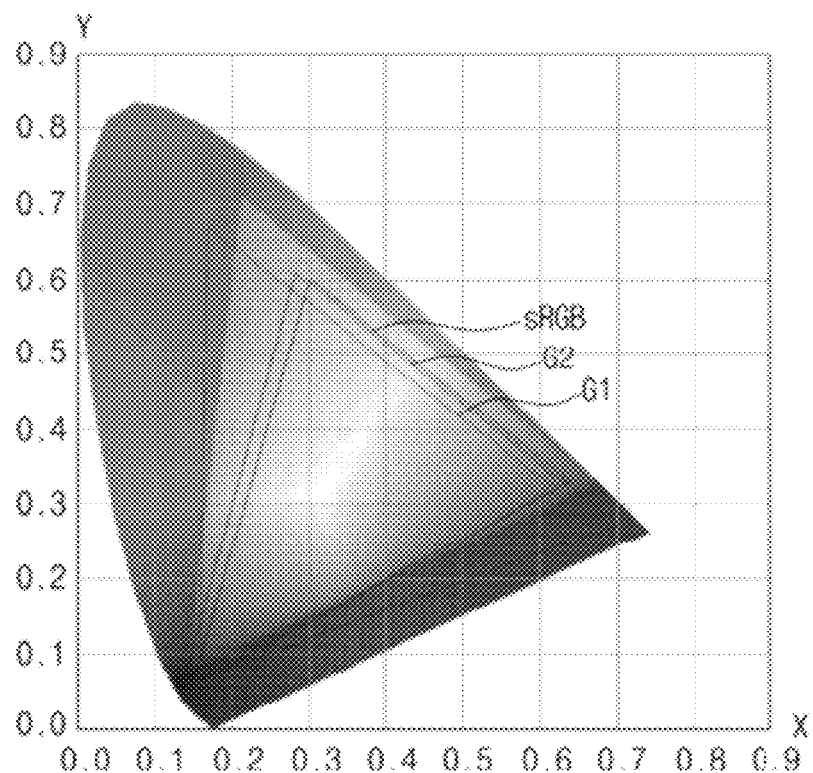
FIG. 11 is a graph illustrating a color reproduction range of the first and second light emitting diode packages of Table 1.

FIG. 11 is a graph a color reproduction range of the first and second light emitting diode packages of Table 1. In Table 1, the color reproduction range of the first light emitting diode package 25 is shown as a first graph G1, and the color reproduction range of the second light emitting diode package 26 is shown as a second graph G2.

Referring to Table 1 and FIG. 11, in the color reproduction of the light emitted from the first and second light emitting diode packages 25 and 26, when the white light emitted from the first and second light emitting diode packages 25 and 26 have the same coordinate in the CIE 1931 coordinate system, the graph shows that the light has accordance rates of about 91.5% and about 97.9% in comparison to the sRGB, which are slightly different from each other. However, the graph shows that color reproduction rates in comparison to the NTSC are almost equal to each other, i.e., areas of reproducible colors are almost equal to each other because the areas of the reproducible colors have about 88.5% and about 88.8% in comparison to the NTSC, respectively. Thus, when the first and second light emitting diode packages 25 and 26 are used for the 3-D image display apparatus, a color difference and brightness difference of light reaching the left and right eyes may be reduced.

Figure 12:
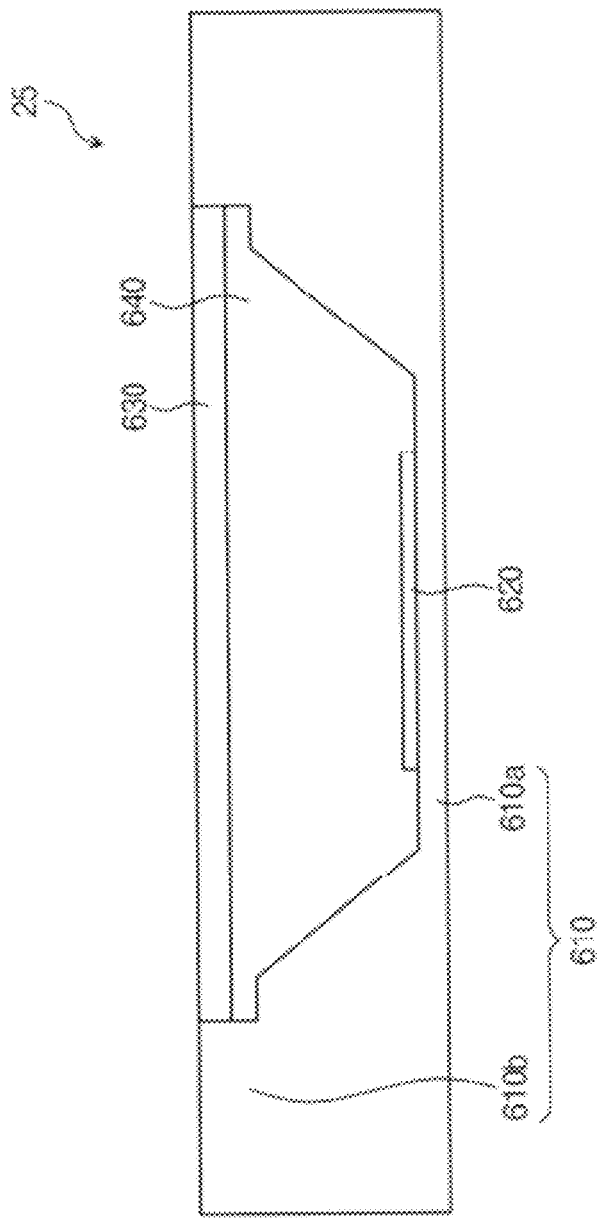
FIG. 12 is a sectional view illustrating another example of the first light emitting diode package of FIG. 2.
Figure 13:
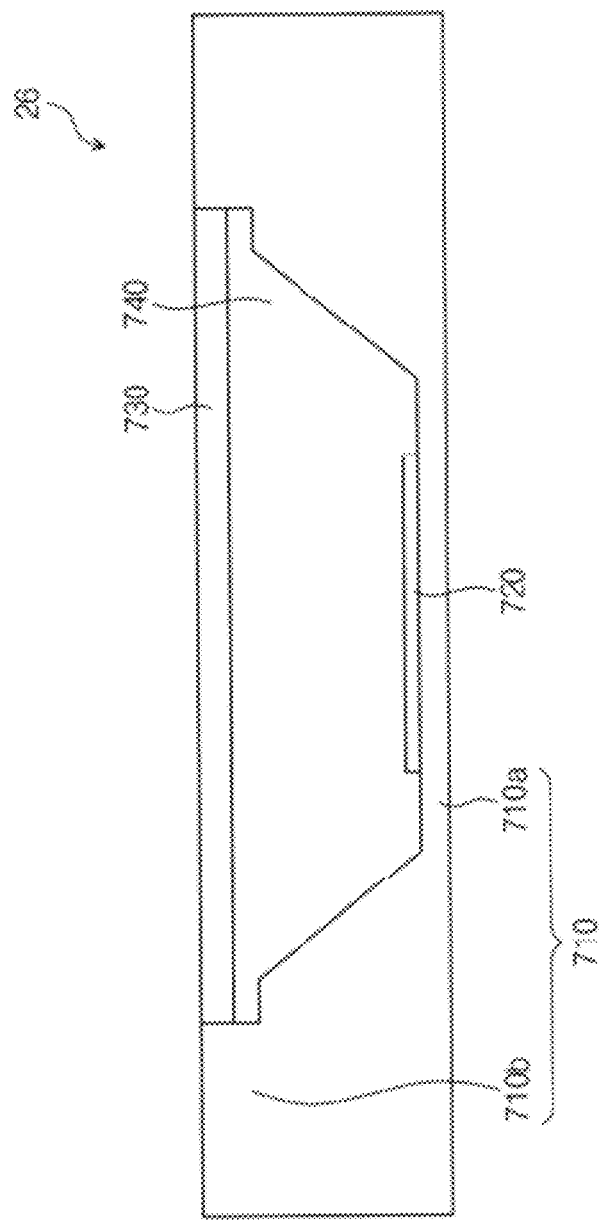
FIG. 13 is a sectional view illustrating another example of a second light emitting diode package of FIG. 2.

FIG. 12 is a sectional view illustrating another example of the first light emitting diode package of FIG. 2, and FIG. 13 is a sectional view illustrating another example of a second light emitting diode package of FIG. 2. In first and second light emitting diode packages 25 and 25 of FIGS. 12 and 13, similar components as those in FIGS. 3 and 7 are denoted by the same reference numerals, and their detailed description will be omitted.

Referring to FIGS. 12 and 13, the first light emitting diode package 25 includes at least one first light emitting diode 620, a first band pass filter 630, a first quantum dot layer 640, and a first housing 610. The second light emitting diode package 26 includes at least one second light emitting diode 720, a second band pass filter 730, a second quantum dot layer 740, and a second housing 710. Unlike FIGS. 3 and 7, in FIGS. 12 and 13 the first quantum dot layer 640 is disposed on the first light emitting diode 620 without having an air layer (650 in FIG. 2). Also, the second quantum dot layer 740 is disposed on the second light emitting diode 720 without having an air layer (750 of FIG. 7). That is, the first quantum dot layer 640 is not in the form of a thin film parallel to the first band pass filter 630, but a space between the first light emitting diode 620 and the first band pass filter 630 is filled with the first quantum dot layer 640, which contacts with the first light emitting diode 620. Also, the second quantum dot layer 740 is not in the form of a thin film parallel to the second band pass filter 730, but a space between the second light emitting diode 720 and the second band pass filter 730 is filled with the second quantum dot layer 740, which contacts with the second light emitting diode 720.

Figure 14:
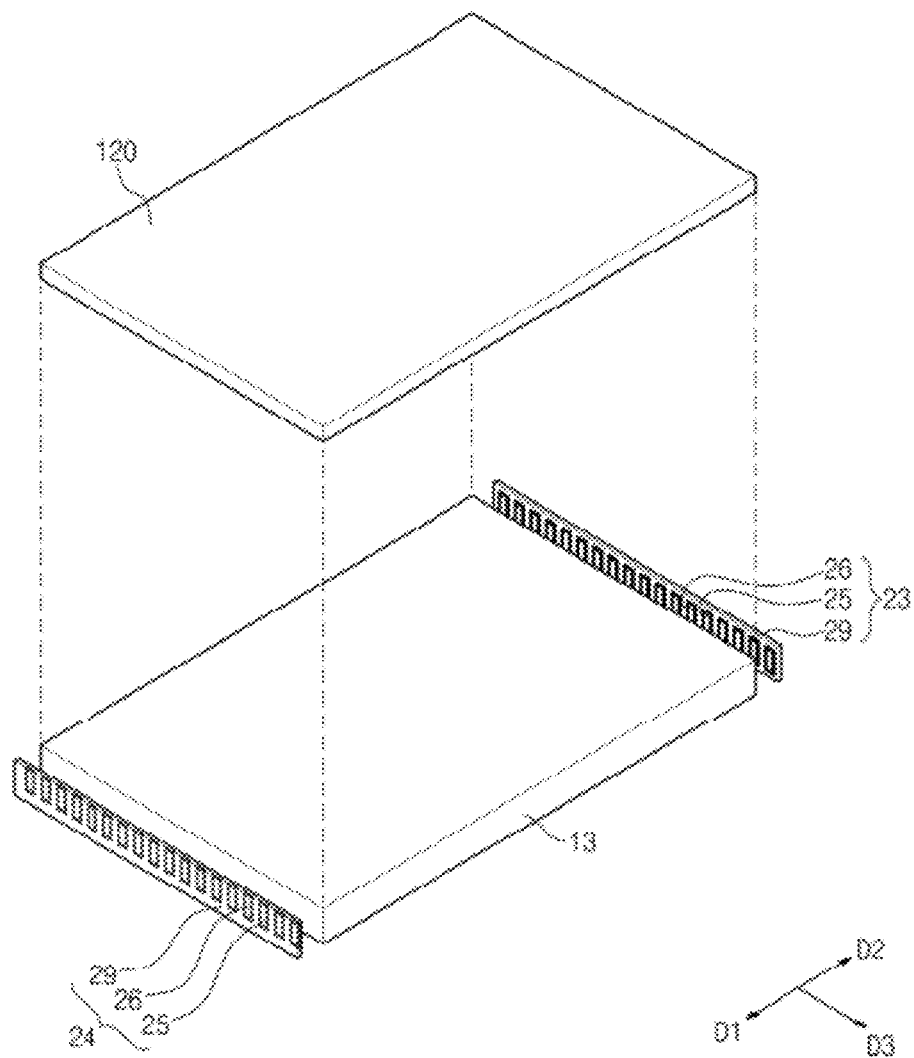
FIG. 14 is an enlarged perspective view illustrating another example of a backlight unit of FIG. 1.

FIG. 14 is an enlarged perspective view illustrating another example of a backlight unit of FIG. 1.

Referring to FIG. 14, the backlight unit includes a first light source 23, a second light source 24, a light guide plate 13, and a diffusion plate 120. Although not shown in FIG. 14, the backlight unit may include a reflection plate and optical sheets as shown in FIG. 1.

The first light source 23 includes a plurality of first light emitting diode packages 25, a plurality of second light emitting diode packages 26, and a printed circuit board (PCB) 29. Also, the second light source includes a plurality of first light emitting diode packages 25, a plurality of second light emitting diode packages 26, and a printed circuit board (PCB) 29.

The first and second light emitting diode packages 25 and 26 of the first and second light sources 23 and 24 are alternately arranged on the PCB 29 in a third direction D3. Light emitted from the first and second light emitting diode packages 25 and 26 of the first light source 23 is emitted in a first direction D1 toward and into the light guide plate 13. Also, light emitted from the first and second light emitting diode packages 25 and 26 of the second light source 24 is emitted in a second direction D2 toward and into the light guide plate 13.

The light guide plate 13 guides the light emitted from the first and second light sources 23 and 24 toward the display panel (see reference numeral 400 of FIG. 1). The diffusion plate 120 diffuses the light emitted from the light guide plate 13.

Figure 15:
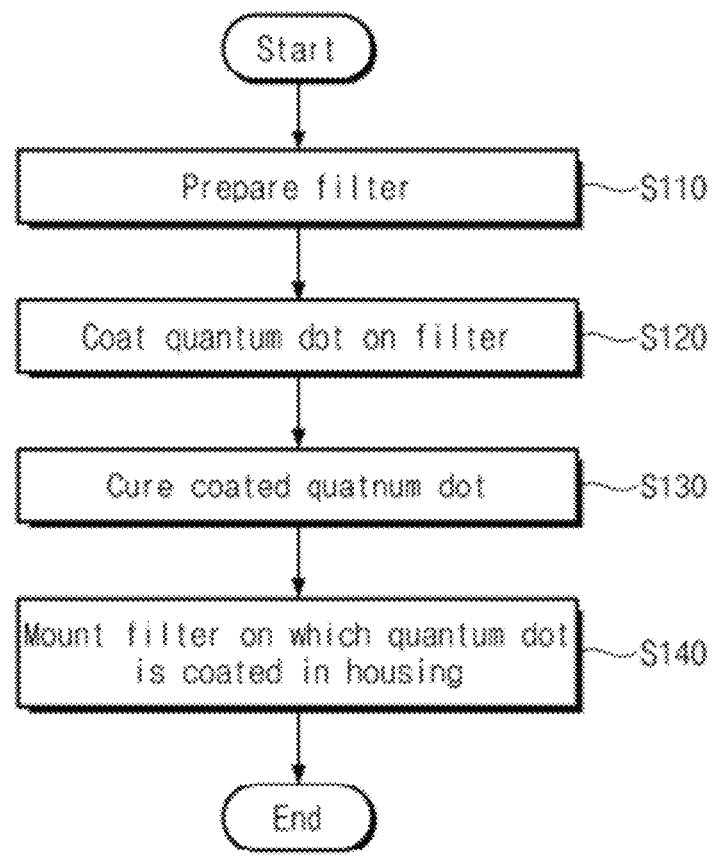
FIG. 15 is a flowchart illustrating a process of forming first and second quantum dot layers of FIGS. 3 and 7.

FIG. 15 is a flowchart illustrating a process of forming first and second quantum dot layers of FIGS. 3 and 7.

Referring to FIGS. 3, 7, and 15, a previously manufactured filter, i.e., a band pass filter (for instance filter 630 in FIG. 3) is prepared in step S110 by methods known to those of skill in the art. Thereafter, in step S120, a quantum dot layer including a plurality of quantum dots is coated on the filter. The quantum dot layer may be dispersed on a polymer resin, for example, and coated onto the filter. For example, a first quantum dot emitting green light and a second quantum dot emitting red light may be mixed with each other and then the mixture may be coated on the filter. For example, the quantum dot layer may be coated using a spin coating process. In step S130, the coated quantum dot layer is cured using heat or light. Then, in step S140, the filter on which the quantum dot layer is coated, i.e., the filter integrated with the quantum dot layer is mounted on a housing including a light emitting diode. When the quantum dot layer is formed on the filter through the above-described processes, a light emitting diode package including the quantum dot layer having a thin film shape may be manufactured.

As described above, a light emitting diode package having high color reproduction for use in a display apparatus includes a light emitting diode emitting the blue light, a quantum dot layer receiving the blue light to emit the green light and the red light, and a band pass filter transmitting the blue light, the green light, and the red light and absorbing light outside of the specific wavelength ranges of the blue light, the green light, and the red light. Also, when the 3D image is displayed using the light emitting diode package, color reproduction range differences and brightness differences between the left eye image and the right eye image may be reduced.

The above-disclosed subject matter is to be considered illustrative and not restrictive, and the appended claims are intended to cover all such modifications, enhancements, and other embodiments, which fall within the spirit and scope of the disclosure. Thus, the scope of the inventive concept is to be determined by the broadest permissible interpretation of the following claims and their equivalents.

What is claimed is:

1. A display apparatus comprising:
   a backlight unit comprising a first light emitting diode package; and
   a display panel configured to display an image,
   wherein the first light emitting diode package comprises:
      a first light emitting diode configured to emit a first wavelength light; and
      a first quantum dot layer comprising first quantum dots and second quantum dots,
      wherein the first quantum dot layer is disposed on the first light emitting diode, the first quantum dots absorb the first wavelength light and emit a second wavelength light and the second quantum dots absorb the first wavelength light and emit a third wavelength light, wherein the first quantum dots and the second quantum dots are mixed together and dispersed within the first quantum layer,
      wherein the first wavelength light has a first peak wavelength that is shifted to one side of a spectral band of a first color, wherein the second wavelength light has a second peak wavelength that is shifted to one side of a spectral band a second color, and wherein the third wavelength light has a third peak wavelength that is shifted to one side of a spectral band of a third color, and
      wherein an amount of a wavelength shift of the second peak wavelength and the third peak wavelength is adjustable by a size of the first quantum dots and the second quantum dots.

2. The display apparatus of claim 1, further comprising an air layer disposed between the first quantum dot layer and the first light emitting diode.

3. The display apparatus of claim 1, wherein the first wavelength light comprises a first blue light that is shifted left from a peak wavelength of a blue color, the second wavelength light comprises a first green light that is shifted left from a peak wavelength of a green color, and the third wavelength light comprises a first red light that is shifted left from a peak wavelength of a red color.

4. The display apparatus of claim 3, further comprising a second light emitting diode package, wherein the second light emitting diode package comprises:
   a second light emitting diode configured to emit a fourth wavelength light; and
   a second quantum dot layer comprising third quantum dots and fourth quantum dots, wherein the second quantum dot layer is disposed on the second light emitting diode, the third quantum dots absorb the fourth wavelength light and emit a fifth wavelength light and the fourth quantum dots absorb the second wavelength light and emit a sixth wavelength light.

5. The display apparatus of claim 4, wherein the fourth wavelength light comprises a second blue light, the fifth wavelength light comprises a second green light, and the sixth wavelength light comprises a second red light.

6. The display apparatus of claim 5, wherein the first and second blue light have wavelengths ranging from about 425 nm to about 475 nm,
the first and second green light have wavelengths ranging from about 500 nm to about 550 nm, and
the first and second red light have wavelengths ranging from about 600 nm to about 650 nm.

7. The display apparatus of claim 5, wherein the first and second blue pass bands transmit wavelengths in a range from about 400 nm to about 500 nm,
the first and second green pass bands transmit wavelengths in a range from about 500 nm to about 580 nm, and
the first and second red pass bands transmit wavelengths in a range from about 580 nm to about 700 nm.

8. The display apparatus of claim 5, wherein the first light emitting diode package emits a first light and the second light emitting diode package emits a second light that has a different light intensity from the first light,
the backlight unit alternately emits the first light and the second light, and
the display panel receives the first light and the second light to display a three-dimensional image.

9. The display apparatus of claim 5, wherein the backlight unit comprises a light guide plate guiding the first light and the second light to the display panel, a first printed circuit board disposed adjacent to a first side of the light guide plate, and a second printed circuit board disposed adjacent to a second side of the light guide plate, and
each of the first and second printed circuit boards includes a plurality of light emitting diode packages.

10. The display apparatus of claim 5, wherein
the second blue light is shifted to an opposite side of the spectral band of the blue color, second green light that is shifted to an opposite side of the spectral band of the green color, and the second red light that is shifted to an opposite side of the spectral band of the red color.

11. The display apparatus of claim 10, wherein an interval between the first peak wavelength of the first blue light and the fourth peak wavelength of the second blue light is at least a full width at half maximum (FWHM) of one of the first and second blue light,
an interval between the second peak wavelength of the first green light and the fifth peak wavelength of the second green light is at least a FWHM of one of the first and second green light, and
an interval between the third peak wavelength of the first red light and the sixth peak wavelength of the second red light is at least a FWHM of one of the first and second red light.

12. the display apparatus of claim 4, further comprising:
a second band pass filter disposed on the second quantum dot layer; and
a second housing receiving the second light emitting diode, the second quantum dot layer, and the second band pass filter.

13. The display apparatus of claim 6, wherein each of the first and second quantum dot layers has a thickness of about 100 nm to about 1,000 μm.

14. The display apparatus of claim 1, further comprising:
a first band pass filter disposed on the first quantum dot layer; and
a first housing receiving the first light emitting diode, the first quantum dot layer, and the first band pass filter.

15. The display apparatus of claim 1, wherein each of the first quantum dots and the second quantum dots has a core formed of a first material having a first band gap, a shell surrounding the core and formed of a second material having a second band gap that is larger than the first band gap.

16. A display apparatus comprising:
a first light emitting diode package; and
a second light emitting diode package;
wherein the first light emitting diode package comprises a first light emitting diode configured to emit a first wavelength light and a first quantum dot layer comprising first quantum dots and second quantum dots that are mixed together and dispersed within the first quantum layer,
wherein the first quantum dots absorb the first wavelength light and emit a second wavelength light and the second quantum dots absorb the first wavelength light and emit a third wavelength light,
wherein the second light emitting diode package comprises a second light emitting diode configured to emit a fourth wavelength light and a second quantum dot layer comprising third quantum dots and fourth quantum dots that are mixed together and dispersed within the second quantum layer,
wherein the third quantum dots absorb the fourth wavelength light and emit a fifth wavelength light and the fourth quantum dots absorb the second wavelength light and emit a sixth wavelength light;
wherein the first wavelength light has a first peak wavelength that is shifted to one side of a spectral band of a first color, wherein the second wavelength light has a second peak wavelength that is shifted to one side of a spectral band of a second color, and wherein the third wavelength light has a third peak wavelength that is shifted to one side of a spectral band of a third color, and
wherein the fourth wavelength light has a fourth peak wavelength that is shifted to an opposite side of the spectral band of the first color, wherein the fifth wavelength light has a fifth peak wavelength that is shifted to an opposite side of the spectral band of the second color, and wherein the sixth wavelength light has a sixth peak wavelength that is shifted to an opposite side of the spectral band of the third color.

17. The display apparatus of claim 16, further comprising:
a first band pass filter disposed on the first quantum dot layer;
a first housing receiving the first light emitting diode, the first quantum dot layer, and the first band pass filter;
a second band pass filter disposed on the second quantum dot layer; and
a second housing receiving the second light emitting diode, the second quantum dot layer, and the second band pass filter.

18. The display apparatus of claim 16, wherein the first wavelength light and the fourth wavelength light provides the first light, wherein the second wavelength light and the fifth wavelength light provides the second light, and wherein the third wavelength light and the sixth wavelength light provides the third light.

19. The display apparatus of claim 18, wherein the first light is blue, the second light is green, and the third light is red.

20. The display apparatus of claim 18, wherein:
a first interval between the first peak wavelength of the first wavelength light and the fourth peak wavelength of the fourth wavelength light is at least a FWHM of one of the first light,
a second interval between the second peak wavelength of the second wavelength light and the fifth peak wavelength of the fifth wavelength light is at least a FWHM of one of the second light, and
a third interval between the third peak wavelength of the third light and the sixth peak wavelength of the sixth wavelength light is at least a FWHM of one of the third light.

\* \* \* \* \*